(12) United States Patent
Mikumo et al.

(10) Patent No.: US 10,962,824 B2
(45) Date of Patent: Mar. 30, 2021

(54) COLOR FILTER SUBSTRATE, METHOD OF PRODUCING THE SAME, AND DISPLAY PANEL

(71) Applicant: SHARP KABUSHIKI KAISHA, Sakai (JP)

(72) Inventors: Katsuhiro Mikumo, Sakai (JP); Junichi Morinaga, Sakai (JP); Hikaru Yoshino, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 362 days.

(21) Appl. No.: 16/191,976

(22) Filed: Nov. 15, 2018

(65) Prior Publication Data

US 2019/0146269 A1    May 16, 2019

(30) Foreign Application Priority Data

Nov. 16, 2017    (JP) .............................. JP2017-220664

(51) Int. Cl.
  *G02B 5/20*      (2006.01)
  *G02F 1/1335*    (2006.01)
  *G03F 7/00*      (2006.01)

(52) U.S. Cl.
  CPC ....... *G02F 1/133516* (2013.01); *G02B 5/201* (2013.01); *G02F 1/133512* (2013.01); *G03F 7/0007* (2013.01)

(58) Field of Classification Search
  CPC ....... G03F 7/0007; G02B 5/201; G02B 5/223; G02F 1/133512; G02F 1/133514; G02F 1/133516

USPC ............................................... 430/7; 349/106
See application file for complete search history.

(56) References Cited

U.S. PATENT DOCUMENTS

| 2004/0223095 A1* | 11/2004 | Tsubata | G02F 1/133512 349/106 |
| 2005/0019679 A1* | 1/2005 | Lo | G02F 1/133516 430/7 |
| 2013/0182205 A1* | 7/2013 | Hibayashi | G02F 1/133707 349/106 |

FOREIGN PATENT DOCUMENTS

JP         H09-189899 A    7/1997

* cited by examiner

*Primary Examiner* — John A McPherson
(74) *Attorney, Agent, or Firm* — ScienBiziP, P.C.

(57) ABSTRACT

A color filter substrate includes a light transmissive substrate, a light blocking layer, a light transmissive layer, and a color layer. The light blocking layer is formed on the light transmissive substrate. The light transmissive layer is formed along an edge of the light blocking layer on the light transmissive substrate. The color layer passes rays of visible light and is tinted a predefined color so that the rays passing therethrough exhibit a predefined color. The color layer includes a section disposed on a top surface of the light transmissive substrate in a blank area and an edge section extending from the section in the blank area over the light transmissive layer and a section of the light blocking layer. A thickness of a section of the light transmissive layer on a blank area side is less than a thickness of the light blocking layer.

5 Claims, 5 Drawing Sheets

COLOR FILTER SUBSTRATE, METHOD OF PRODUCING THE SAME, AND DISPLAY PANEL

CROSS REFERENCE TO RELATED APPLICATION

This application claims priority from Japanese Patent Application No. 2017-220664 filed on Nov. 16, 2017. The entire contents of the priority application are incorporated herein by reference.

TECHNICAL FIELD

The technology described herein relates to a color filter substrate, a method of producing the color filter substrate, and a display panel.

BACKGROUND

A known display panel for displaying color images includes a color filter substrate. The color filter substrate includes a color filter that includes multiple color layers having different light transmissivities (e.g., red (R), green (G), and blue (B) color layers) and a light blocking layer (a BM layer, a black matrix layer) disposed among the color layers for reducing color mixture. In the display panel, light applied to a back surface of the color filter substrate (on an opposite side from a display surface side) passes through the color filter to a front surface of the color filter substrate (on the display surface side) to display the color images.

In a production of the color filter including the color layers and the light blocking layer, the light blocking layer is formed in a predefined pattern on a transparent glass substrate and the color layers containing pigments in respective colors are formed in sequence. It is preferable that the color layers are formed such that no gaps are present between the light blocking layer and the color layers when viewed in a normal direction to the plate surface of the substrate. To reduce gaps between the light blocking layer and the color layers, the color layers are formed to extend over sections of the light blocking layer.

Metal films have been used to construct light blocking layers in color filters. However, resin films containing black inks are more likely to be used to construct light blocking layers for cost reduction. A light blocking layer constructed from a resin film has a thickness larger than thicknesses of light blocking layers constructed from metal films to achieve a sufficient level of light blocking performance. Therefore, a difference in level between the top surface of the transparent substrate and a top surface of the light blocking layer becomes larger.

When the difference becomes larger, a thickness of sections of the color layers along edges of the light blocking layer in the normal direction to the plate surface of the substrate also become larger (see FIG. 5). Therefore, light rays exiting through the sections of the color layers may be deeply colored resulting in color evenness or the numbers of light rays passing through the sections decrease resulting in reduction in light transmissivity.

A technology for reducing such a difference is disclosed in Japanese Unexamined Patent Application Publication No. H9-189899. A light blocking layer in H9-189899 includes edge sections with small steps. The light blocking pattern made of resin is formed on a light transmissive substrate by forming layers such that widths of upper-layers are smaller than widths of lower layers or widths of upper layer are larger than widths of lower layers. According to the configuration, the thickness of the light blocking pattern in the middle is larger and decreases toward the edges and thus differences in level among the steps between the light transmissive substrate and the light blocking pattern decrease.

In recent years, definition of screen has been increasing and areas of pixels have been decreasing. Therefore, a percentage of a light blocking layer in a screen of a display panel or a percentage of tick sections of color layers increases and thus overall brightness of the screen of the display panel decreases. In a liquid crystal display device, brightness of a liquid crystal panel can be maintained at a high level by increasing an amount of light supplied by a backlight unit disposed behind the liquid crystal panel. However, power consumption of the backlight unit increases. Therefore, the liquid crystal display device may not be suitable for an electronic device driven with a battery power. It is preferable to maintain the brightness of the screen by maintaining a light exiting rate (a light utilization rate) of the display panel without an increase in amount of light supplied by the lighting unit.

The technology disclosed in H9-189899 may be able to maintaining the brightness that may decrease due to the increase in thickness of the color layers. However, a certain width is required for the light blocking pattern. Therefore, fine patterning may be difficult and thus the technology may not be applied to high-definition display panels. Furthermore, light blocking layer with stepped edge sections or tapered edge sections may not be able to provide proper light blocking performance in the edge sections. Therefore, boundaries between different colors may not be clearly defined. Still furthermore, according to a method disclosed in H9-189899, multiple times of the photolithography process may be required to form the light blocking layer from the multiple layers. Therefore, the production process may be complicated. The method further requires several patterns to form the light blocking layer.

SUMMARY

The technology described herein was made in view of the above circumstances. An object is to provide a color filter substrate including a light blocking layer and a color layer and in which density unevenness and a decrease in light transmissivity are less likely to occur around the light blocking layer.

A color filter substrate according to the technology described herein includes a light transmissive substrate, a light blocking layer, a light transmissive layer, and a color layer. The light transmissive substrate is configured to pass rays of visible light. The light blocking layer is formed in a predetermined pattern on the light transmissive substrate to block rays of the visible light. The light transmissive layer is formed along an edge of the light blocking layer on the light transmissive substrate. The color layer is formed on the light transmissive substrate, configured to pass rays of the visible light, and tinted a predefined color so that the rays of the visible light passing therethrough exhibit a predefined color. The color layer includes a section disposed on a top surface of the light transmissive substrate in a blank area in which the light blocking layer and the light transmissive layer are not present and an edge section extending from the section in the blank area over a top surface of the light transmissive layer and a section of a top surface of the light blocking layer. The light transmissive layer has light transmissivity greater than light transmissivity of the color layer for an entire wavelength range of the visible light. The light transmissive layer is formed so that a thickness of a section on a blank area side is less than a thickness of the light blocking layer.

In the color filter substrate having the configuration described above, the color layer is disposed on the light transmissive substrate without the light blocking layer and the light transmissive layer between the color layer and the light transmissive substrate in the blank area. Therefore, the light transmissivity in the blank area is maintained at a high level. The color layer includes the section disposed in the blank area and the edge section extending from the section over the top surface of the light blocking layer. A leak of light is less likely to occur around the light blocking layer.

In the color filter substrate, the thickness of the section of the light transmissive layer on the blank area side is less than the thickness of the light blocking layer. The light transmissive layer is disposed along the edge of the light blocking layer. According to the configuration, differences in level between the light transmissive substrate and the light blocking layer are reduced. The thickness of the color layer in the normal direction to the plate surface of the light transmissive substrate around the light blocking layer is less likely to increase. The light transmissive layer has the light transmissivity greater than the light transmissivity of the color layer for the entire wavelength range of the visible light. In comparison to a configuration in which the thickness of the color layer around the light blocking layer is increased, the density unevenness and the decrease in light transmissivity are less likely to occur around the light blocking layer.

The light blocking layer having the configuration described above can be formed through a process similar to a known process. Therefore, the light blocking layer can be finely patterned and the color filter substrate that can be used for a high-definition display panel is obtained. The light blocking layer includes an edge having a sufficient thickness. Therefore, a boundary between different colors can be clearly defined.

The color filter substrate according to the technology described herein may be produced using a method of producing a color filter substrate. The method includes: forming a light blocking layer in a predefined pattern on a light transmissive substrate configured to pass rays of visible light to block rays of the visible light; forming a light transmissive layer along an edge of the light blocking layer on the light transmissive substrate to pass rays of the visible light; and forming a color layer tinted so that rays of the visible light passing therethrough exhibit a predefined color on a top surface of the light transmissive substrate such that a section of the color layer is disposed in a blank area in which the light blocking layer and the light transmissive layer are not present and an edge section of the color layer extends from the section in the blank area over a top surface of the light transmissive layer and a section of a top surface of the light blocking layer. The forming the light transmissive layer includes curing a photosensitive resin using a halftone mask configured to reduce an amount of exposing light from the light blocking layer side to the blank area side so that the thickness of the section of the light transmissive layer on the blank area side is less than the thickness of the section of the light transmissive layer on the light blocking layer side.

With a simple method, the light transmissive layer including the section on the light blocking layer side with the thickness equal to or less than the thickness of the light blocking layer and the section on the blank area side with the thickness less than the thickness of the section on the light blocking layer side is formed. The thickness of the color layer in the normal direction to the plate surface of the light transmissive substrate is further less likely to vary. According to the method, the color filter in which the density unevenness and the decrease in light transmissivity are less likely to occur is obtained.

With the color filter substrate having the configuration described above, a display panel that has light transmissivity maintained at a higher level and can be used for a high-definition and high-intensity display device is obtained.

According to the technology described herein, the density unevenness and the decrease in light transmissivity are less likely to occur in the color filter substrate that includes the light blocking layer and the color layer. By applying the technology described herein to a display panel that includes the color filter substrate, the display panel that can be used for a high-definition and high-intensity display device can be obtained.

DETAILED DESCRIPTION

First Embodiment

Figure 1:
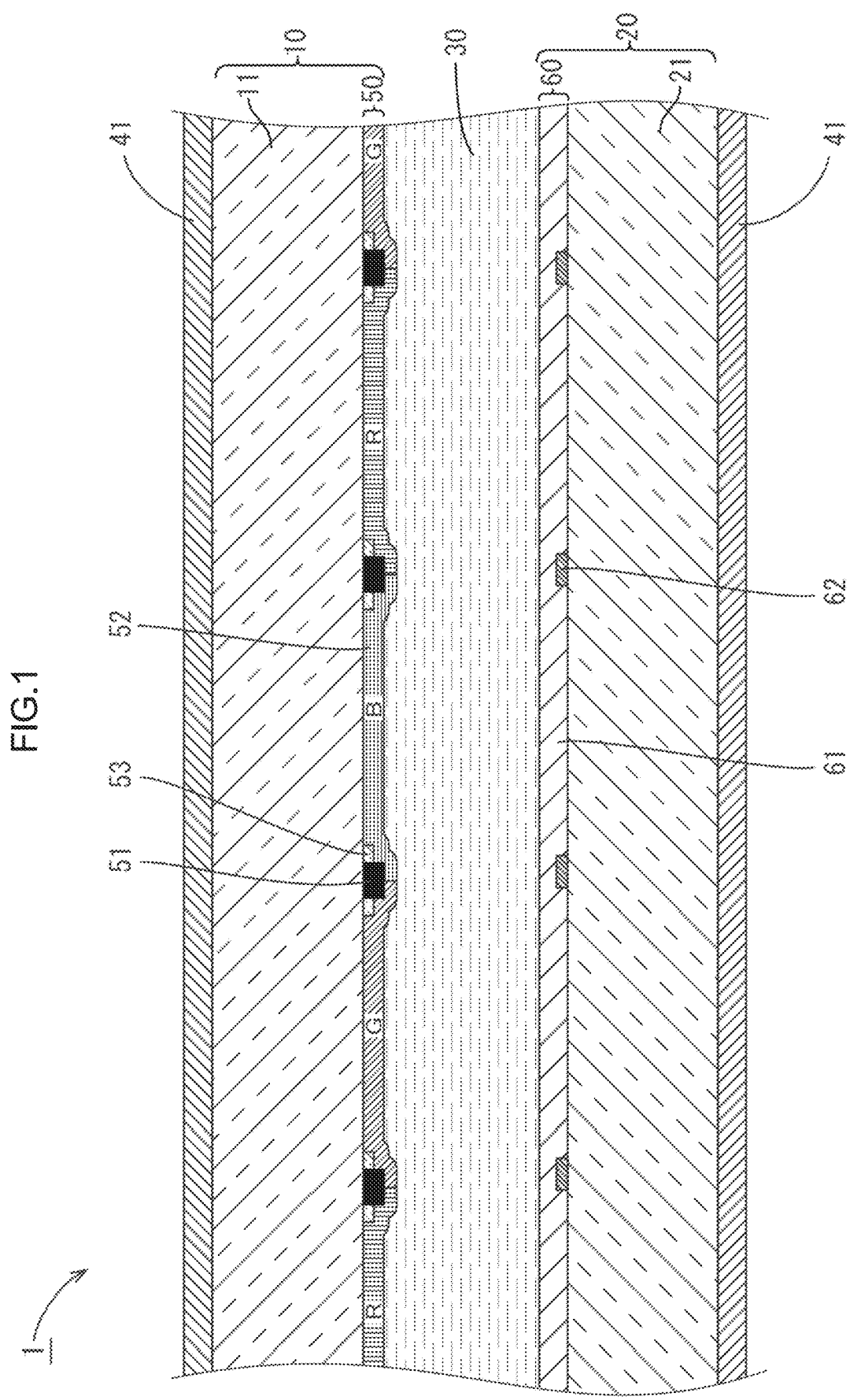
FIG. 1 is a schematic view illustrating a schematic cross-sectional configuration of a liquid crystal panel according to a first embodiment.

A first embodiment will be described with reference to FIGS. 1 to 3. In this section, a liquid crystal panel 1 (a display panel) will be described. An upper side and a lower side in FIG. 1 correspond to a front side and a back side of the liquid crystal panel 1. In FIG. 1, one of components in the same kind may be indicated by a reference sign and others may not be indicated by reference signs.

The liquid crystal panel 1 may be used for, but not limited to, a display panel in an electronic device such as a mobile phone (e.g., a smartphone), a notebook personal computer (e.g., tablet personal computer), and a liquid crystal television. The technology described herein may be applied to, but not limited to, a small size display panel with a screen size of some inches or a medium to large size display panel with a screen size of tens of inches (or an extra-large display panel).

A schematic configuration of the liquid crystal panel 1 will be described with reference to FIG. 1. A middle area of a plate surface of the liquid crystal panel 1 is defined as a display area in which images are displayed. A cross-sectional configuration of the liquid crystal panel in the display area is schematically illustrated in FIG. 1.

As illustrated in FIG. 1, the liquid crystal panel 1 includes a CF substrate 10 (a color filter substrate), an array substrate 20 (an active matrix substrate, a pixel electrode substrate), and a liquid crystal layer 30. The CF substrate 10 and the array substrate 20 are opposed to each other with a predefined gap and bonded to each other. The liquid crystal layer 30 includes liquid crystal molecules sealed in a space between the CF substrate 10 and the array substrate 20. The liquid crystal molecules are substances having optical characteristics that changes according to application of an electric field between the CF substrate 10 and the array substrate 20. Polarizing plates 41 are attached to outer plate surfaces of the CF substrate 10 and the array substrate 20.

A front plate surface of the CF substrate 10 on the front side of the liquid crystal panel 1 is defined as a display surface (a front surface). A backlight unit is disposed behind a back surface of the array substrate 20 on the back side to illuminate the liquid crystal panel 1. Namely, light is applied to the liquid crystal panel 1 from the lower side in FIG. 1 (the back surface side) to the upper side in FIG. 1 (the front surface side).

The array substrate 20 includes a light transmissive substrate that is substantially transparent and configured to pass rays of visible light. The light transmissive substrate may be a glass substrate, a silicon substrate, or a heat-resistant plastic substrate. In this embodiment, the array substrate 20 includes a glass substrate 21. As illustrated in FIG. 1, a multilayer film 60 is formed on an inner surface of the glass substrate 21 (on the liquid crystal layer 30 side opposed to the CF substrate 10). The multilayer film 60 includes different kinds of films formed in predefined patterns through the photolithography process or other known film forming technology.

The multilayer film 60 includes a first metal film (a gate metal film), a gate insulating film, a semiconductor film, a second metal film (a source metal film), a first interlayer insulating film, a planarization film 61 (an insulating film, a first insulating film, a lower insulating film), a first transparent electrode film, a second interlayer insulating film (an insulating film, a second insulating film, an upper insulating film), a second transparent electrode film, and an alignment film disposed in this sequence from the lower side (the glass substrate 21 side farther from, the liquid crystal layer 30). In FIG. 1, the planarization film 61 having the largest thickness is indicated with the reference sign.

In a section of the array substrate 20 in the display area, thin film transistors (TFTs) and pixel electrodes are disposed in a matrix. The TFTs are switching components. Furthermore, gate lines (scanning lines) and source lines 62 (datelines, signal lines) are routed in a grid to surround the TFTs and the pixel electrodes. The gate lines and the source lines 62 are connected to gate electrodes and source electrodes, respectively. The pixel electrodes are connected to drain electrodes of the TFTs. A common electrode is disposed to overlap the pixel electrodes.

In the array substrate 20, a common voltage (a reference voltage) is applied to the common electrode via a common line. Application of voltages to the pixel electrodes is controlled through driving of the TFTs based on signals supplied via the gate lines and the source lines 62. When a certain potential difference is created between the pixel electrode and the common electrode, a fringe electric field (an orthogonal electric field) including a component in the normal direction to the plate surface of the array substrate 20 is applied to the liquid crystal layer 30 between the array substrate 20 and the CF substrate 10. By controlling the electric field to adjust orientations of the liquid crystal molecules in the liquid crystal layer 30, images are displayed in the display area.

The CF substrate 10 opposed to the array substrate 20 is provided for adding colors to the display images. The CF substrate 10 includes a light transmissive substrate having insulating property. The light transmissive substrate may be a glass substrate, a silicon substrate, or a heat-resistant resign substrate. A substantially transparent colorless substrate configured to pass visible light in an entire wavelength range from 400 nm to 700 nm. In this embodiment, the CF substrate includes a glass substrate 11 (a light transmissive substrate). As illustrated in FIG. 1, a color filter 50 is disposed on the back surface of the glass substrate 11 (on the liquid crystal layer 30 side opposed to the array substrate 20) in the display area. An overcoat is disposed on the surface of the color filter 50.

Photo spacers may be provided at positions overlapping a light blocking layer 51 in the display area to protrude from the surface of the overcoat toward the array substrate 20. The photo spacers may be made of photo sensitive resin material. The photo spacers may have a predefined height so that distal ends of the photo spacers contact the inner surface of the array substrate 20 to maintain the predefined gap (a cell gap) between the CF substrate 10 and the array substrate 20 and thus the liquid crystal layer 30 is disposed therebetween.

An alignment film is disposed in an innermost layer on a section of the CF substrate 10 in the display area. The alignment film is disposed over the surfaces of the photo spacers. The alignment film contacts the liquid crystal layer 30. The liquid crystal layer 30 is sandwiched between the alignment film on the CF substrate 10 and the alignment film on the array substrate 20. The alignment films are configured to adjust the orientations of the liquid crystal molecules in a certain direction. The alignment films may be made of polyimide. Polyimide films are configured as photo alignment films to orientate the liquid crystal molecules along a direction in which light in a specific wavelength range (e.g., ultraviolet rays) is applied.

Next, the color filter 50 included in the CF substrate 10 will be described with reference to FIGS. 2 and 3. The color filter 50 includes the light blocking layer 51 (the black matrix layer, the BM layer) and color layers 52. The light blocking layer 51 is formed in the predefined pattern on the back surface of the glass substrate 11 to block rays of the visible light. The color layers 52 are configured to pass rays of the visible light and colored so that the rays of the visible light passing therethrough exhibit predefined colors.

The light blocking layer 51 is disposed among the color layers 52 to reduce the color mixture. The light blocking layer 51 is made of resin material containing light blocking substances dispersed therein. A phenol resin, a polyimide resin, or an acrylic resin may be used for the resin material; however, a photosensitive resin may be preferable for forming the light blocking layer 51 through the photolithography process. The light blocking layer 51 is made of photosensitive resin. Black pigments such as carbon blacks and titanium blacks may be used for the light blocking substances. The resin material and the light blocking substances are not limited to those described above.

Figure 2:
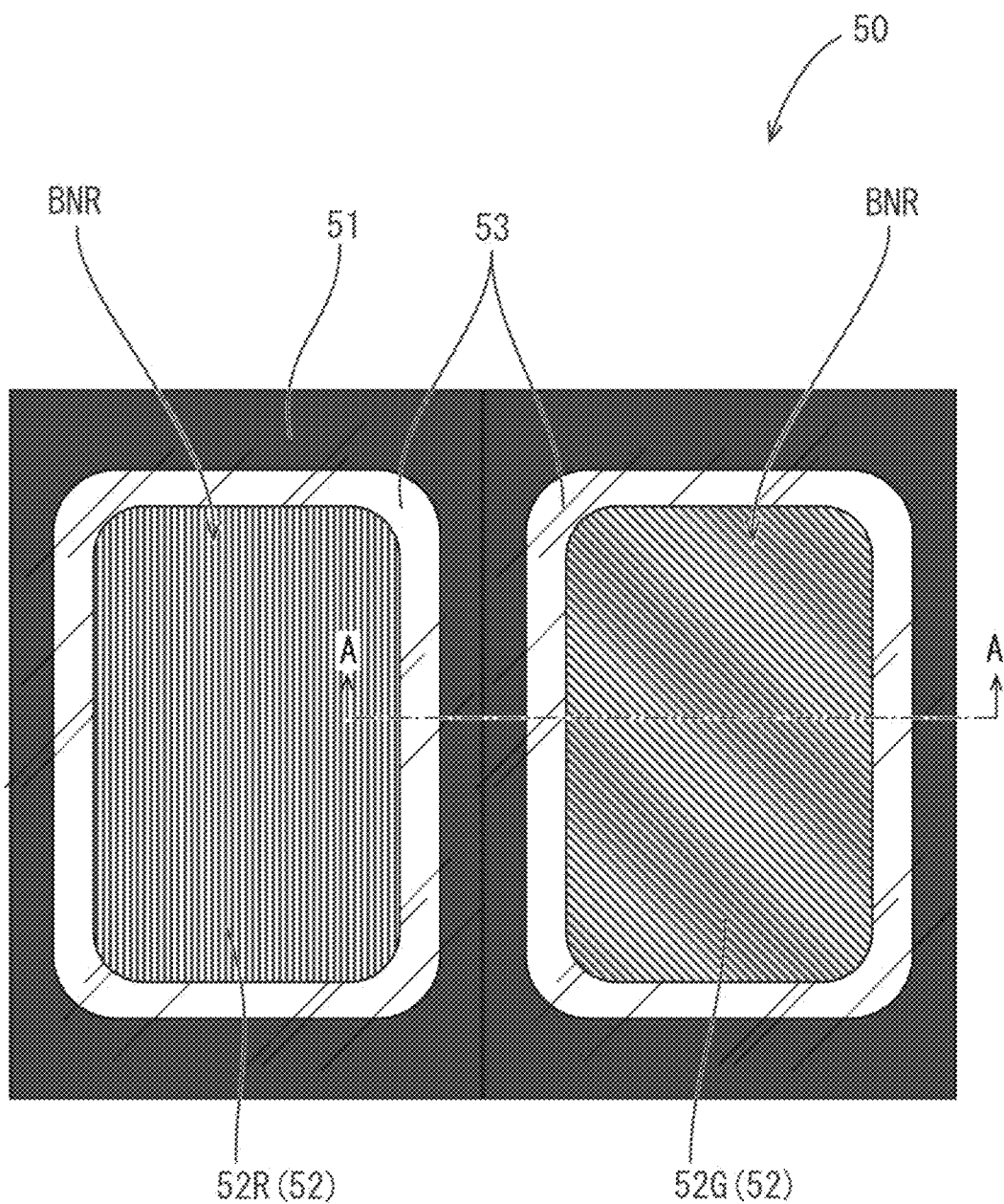
FIG. 2 is a schematic view illustrating a two-dimensional configuration of a CF substrate.

As illustrated in FIG. 2, the light blocking layer 51 is formed in the grid pattern. The light blocking layer 51 is disposed in the area of the CF substrate 10 corresponding to the display area and extends to edge areas of the CF substrate 10 corresponding to sections of the non-display area. According to the configuration, a leak of light from a periphery of the screen can be reduced and thus screen contract improves.

Preferably, the light blocking layer 51 has a thickness d1 in a range from 0.8 μm to 2.0 μm, more preferably, from 1.0 μm to 1.8 μm. If the thickness d1 is less than the range, a sufficient level of light blocking performance cannot be achieved. If the thickness d1 is greater than the range, the problem, resulting from the increase in thickness of the color layers may become bigger and arrangement errors may occur due to irregularity of the back surface of the CF substrate 10, This may reduce the display quality. The thickness of the light blocking layer 51 is set to about 1.4 μm.

The color layers 52 tint the passing light rays the predefined colors. The color layers 52 include red color layers 52R, green color layers 52G, and blue color layers 52B that are repeatedly arranged in predefined sequence to form the matrix. Hereinafter, suffixes R, G, and B are added to the reference numeral of the color layers to separately describe the different colors of the color layers and the suffixes are not added to the reference numeral to collectively describe the color layers. Each color of the color layers 52R, 52G, and 52B is made of resin material in which dyes or pigments in corresponding color (red, green, or blue) are dispersed. A polyimide resin or an acrylic resin may be used for the resin material; however, a photosensitive resin is preferable for the resin material to form the color layers 52 through the photolithography process. The color layers 52 are made of photosensitive resin.

The color layers 52 are arranged in conjunction with the light blocking layer 51. As illustrated in FIG. 2, the red color-layers 52R, the green color layers 52G, and the blue color layers 52B are disposed in void portions of the light blocking layer 51. The arrangement of the color layers 52 will be described later.

Preferably, a thickness 62 of each color layer 52 is in a range from 0.7 μm to 3.0 μm, more preferably, in a range from 1.0 μm to 2.0 μm. If the thickness d2 is less than the range, the light rays are not sufficiently tinted. If the thickness d2 is greater than the range, an excessive decrease in light transmissive rate may occur. The thickness d2 in each color layer 52 is set to 1.2 μm, which is slightly less than the thickness d1 of the light blocking layer 51.

As illustrated in FIG. 2, the color filter 50 includes light transmissive layers 53 along edges of the light blocking layer 51. The light transmissive layers 53 are substantially transparent layers having light transmissive rates higher than the light transmissive rates of the color layers 52 for an entire wavelength range of the visible light from 400 nm to 700 nm. Preferably, the light transmissive layers 53 are made of resin having the light transmissive rates of 80% or greater for the entire wavelength range, more preferably, 90% or greater. Preferably, a colorless transparent resin may be used for the transparent resin may be a slightly tinted resin having a transmissive rate in each wavelength in the visible light range different from transmissive rates in other wavelengths in the visible light range.

A thermoplastic resin, a thermosetting resin, or a photosensitive resin may be used for the transparent resin. Examples of the thermoplastic resin include the photosensitive resin include a polyolefin, a polyester, and an acrylic-based resin. Examples of the thermosetting resin include an epoxy resin, a phenol resin, and a melamine resin. Examples of the photosensitive resin include a phenol resin, a polyimide resin, and an acrylic resin. The photosensitive resin is preferable to form the light transmissive layer 53 through the photolithography process. The light transmissive layer 53 is made of photosensitive resin.

As illustrated in FIG. 2, the light transmissive layers 53 are formed in frame shapes along edges of the light blocking layer 51. In areas inner than inner edges of the light transmissive layers 53, neither the light blocking layer 51 nor the light transmissive layers 53 are present. The areas are defined as blank areas BNR in which the color layers 52 are disposed directly on the glass substrate 11 without the light blocking layer 51 and the light transmissive layers 53 between the glass substrate 11 and the color layers 52. Each section of the light transmissive layers 53 in the frame shapes has a constant width of about ½ of a width of each section of the light blocking layer 51. The width of each light transmissive layer 53 may be set where appropriate according to a balance between a level of density unevenness and screen brightness.

Figure 3:
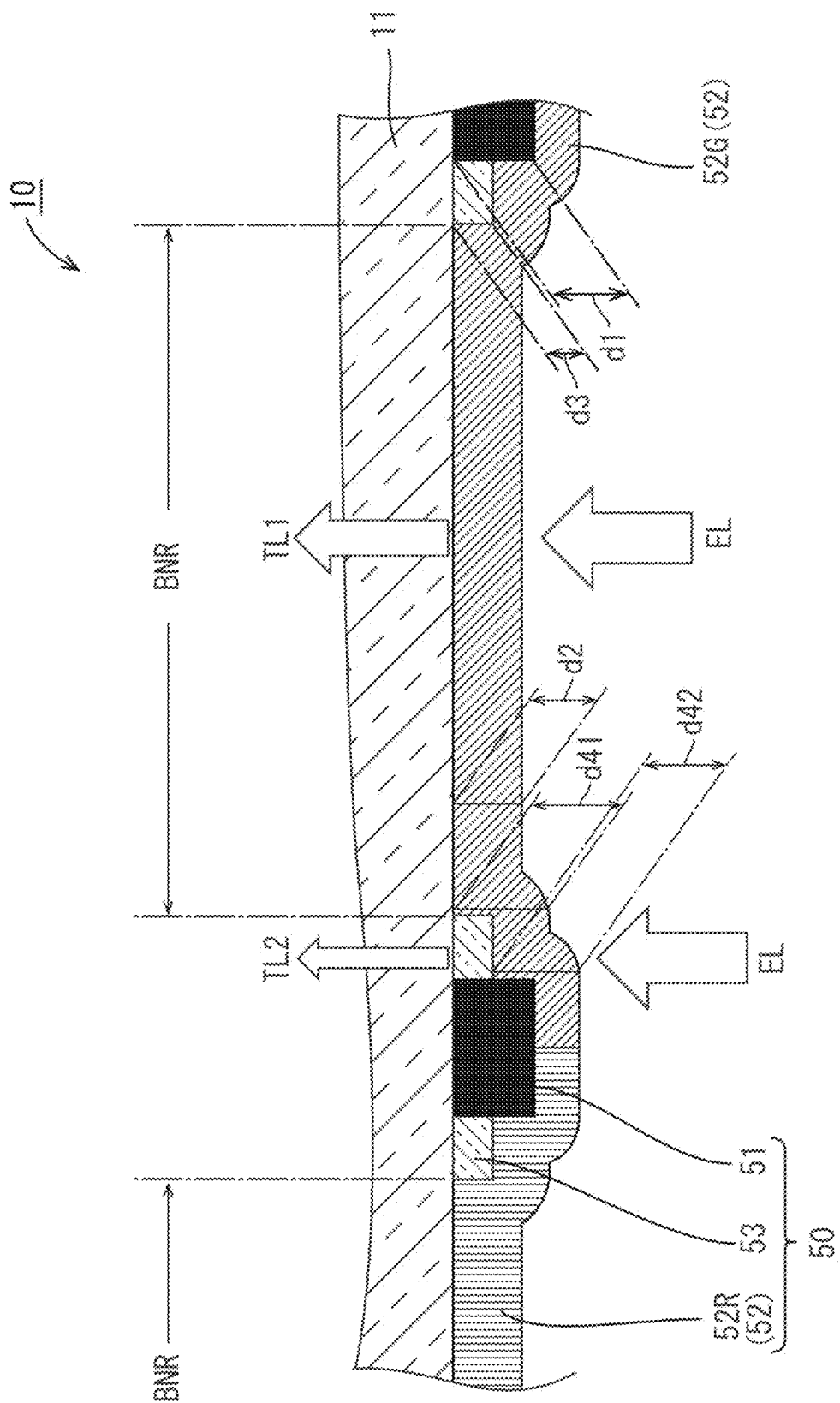
FIG. 3 is a schematic view illustrating a cross-sectional configuration of a color filter including a light blocking layer and therearound along line A-A in FIG. 2.

As illustrated in FIG. 3, each light transmissive layer 53 has a constant thickness d3. The thickness 63 of the light transmissive layers 53 is less than the thickness d1 of the light blocking layer 51 (d3<d1). The thickness d3 of the light transmissive layers 53 is set to about 0.7 μm, which is about ½ of the thickness d1 of the light blocking layer 41.

The arrangement of the color layers 52 and other relevant layers will be described in detail. As illustrated in FIG. 2, in the two-dimensional configuration of the color filter 50, the light transmissive layers 53 in the frame shapes are disposed in the voids of the light blocking layer 51 along the edges of the voids. The color layers 52R, 52G, and 52B are disposed to cover the blank areas BNR defined by the inner edges of the light transmissive layers 53. In FIG. 2, the blank area BNR on the left is covered with the red color layer 52R and the blank area BNR on the right is covered with the green color layer 52G. The color layers 52R, 52G, and 52B include sections disposed in the blank areas BNR and edge sections extending from the sections in the blank areas BNR over the light transmissive layers 53 and sections of the light blocking layer 51. When viewed from the back side, the color layers 52R, 52G, and 52B having rectangular shapes are closely arranged to each other with edges opposed to each other on the back surface of the light blocking layer 51 to cover an entire section of the CF substrate 10 in the display area.

As illustrated in FIG. 3, in the cross-sectional configuration of the color filter 50, the color layers 52R, 52G, and 52B are disposed on the back surface of the glass substrate 11 in the blank areas BNR without the light blocking layer 51 or the light transmissive layers 53 between the back surface of the glass substrate 11 and the color layers 52R, 52G, and 52B. The edge sections of the color layers 52R, 52G, and 52B are disposed over the back surfaces of the light transmissive layers 53 (a top surface, surfaces on the liquid crystal layer 30 side) and the sections of the back surface of the light blocking layer 51 (a top surface). The edges of the color layers 52R, 52G, and 52B are adjacent and opposed to each other. In FIG. 3, the red color layer 52R on the left is connected with the green color layer 52G on the right with the edge of the red color layer 52R contacting the edge of the green color layer 52G on the back surface of the light blocking layer 51 on the left in FIG. 3.

A method of producing the CF substrate 10 will be described. The glass substrate 11 is prepared. The light blocking layer 51 is formed in the predefined pattern on the glass substrate 11 and the light transmissive layers 53 formed along the edges of the light blocking layer 51 through the photolithography process. The color layers 52 are formed through the photolithography process. The sections of the color layers 52 are formed in the blank areas BNR and the edge sections are formed to extend over the back surfaces of the light transmissive layers 53 and the sections of the back surface of the light blocking layer 51. The overcoat layer is formed to cover the color filter 50. The photo spacers may be formed if required. The alignment film is formed to cover the surfaces of those layers on the inner side (the liquid crystal layer 30 side) with the spin coat technology. This completes the production process of the CF substrate 10.

Figure 5:
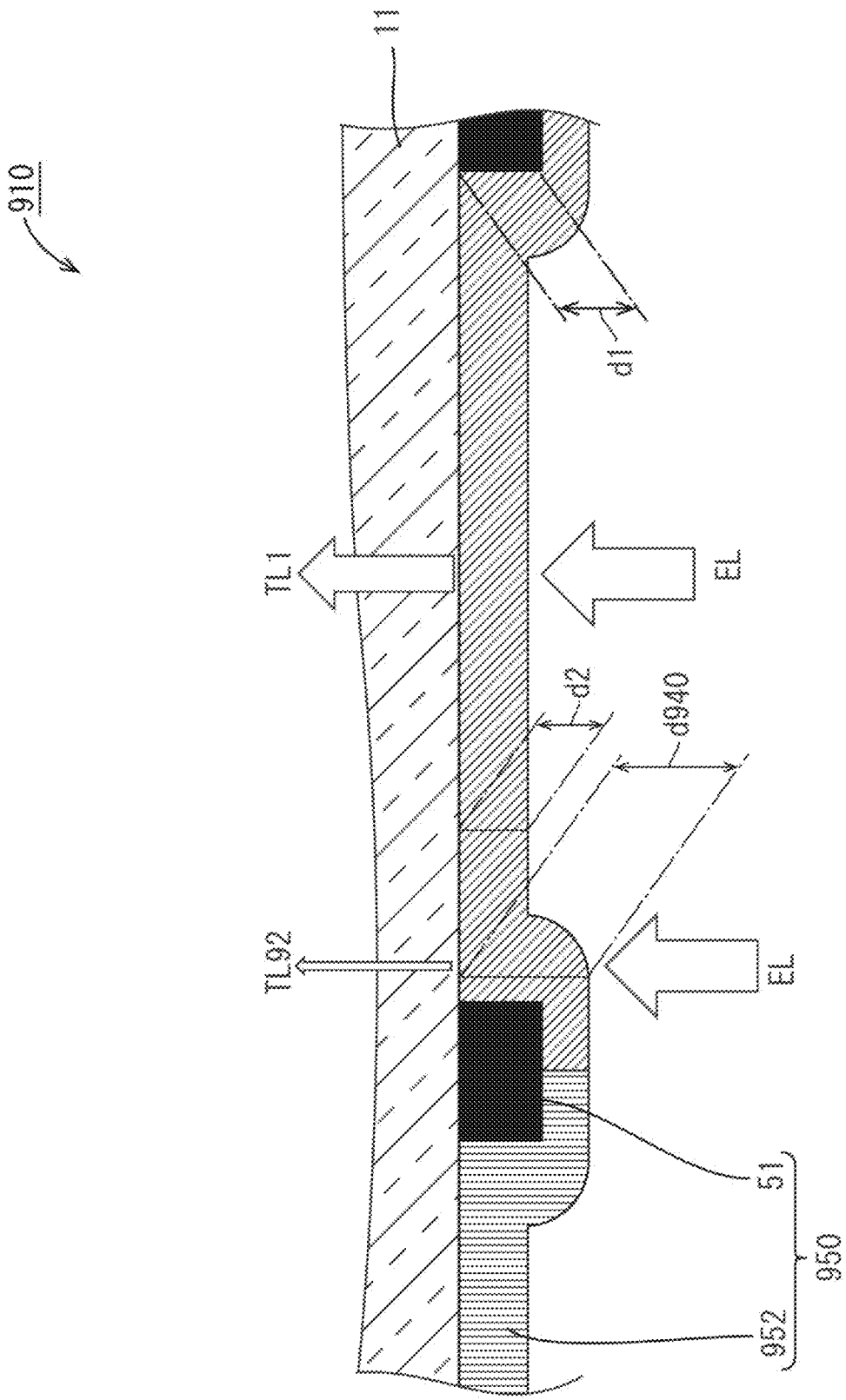
FIG. 5 is a schematic view illustrating a cross-sectional configuration of a color filter including a light blocking layer and therearound according to a related art.

Transmission of light through the CF substrate will be described in comparison to transmission of light through a conventional CF substrate 910 with reference to FIGS. 3 and 5. The conventional CF substrate 910 including a color filter 950 that does not include the light transmissive layers 53 is illustrated in FIG. 5. Components of the conventional CF substrate 910 the same as the components of the CF substrate 10 will be indicated by reference signs the same as those of the CF substrate 10 and will not be described in detail. The color filter 950 includes color layers 952 and the light blocking layer 51 having the thickness d1. The color layers 952 have a thickness equal to the thickness of the color layers 52.

As illustrated in FIG. 5, the color layers 952 are disposed on the back surface of the glass substrate 11 such that edge sections of the color layers 952 extend over the back surface (a top surface) of the light blocking layer 51. To make boundaries between different colors clear, the edges of the light blocking layer 51 have a sufficient thickness. The edges of the light blocking layer 51 are substantially perpendicular to the plate surface of the glass substrate 11. Edges of the color layers 952 along the edges of the light blocking layer 51 bend at about the right angle along surfaces of the glass substrate 11 and the light blocking layer 51. A difference in level between the back surface of the glass substrate 11 and the back surface of the light blocking layer 51 is equal to the thickness d1 of the light blocking layer 51. As illustrated in FIG. 5, the maximum thickness d940 of the color layers 952 in the normal direction to the plate surface of the glass substrate 11 is about equal to a sum of d1 and d2. The maximum thickness d940 is greater than the thickness d2 of other sections of the color layers 952 by d1. If the thickness d2 of the other sections of the color layers 952 is about 1.2 μm and the maximum thickness d940 is about 2.6 μm, the maximum thickness d940 is about 2.17 times greater than the thickness d2.

When light EL is applied to the back surface of the conventional CF substrate 910, transmitting light TL 92 through the area closer to the edge of the light blocking layer 51 is deeply tinted and an amount of transmitting light TL 92 decreases resulting in an reduction in light transmitting rate in comparison to transmitting light TL1 through other sections of the color layer 952. In a liquid crystal panel including the conventional CF substrate 910, significant density unevenness occurs in the display area and thus the light transmitting rate decreases resulting in a reduction in overall brightness of the screen.

As illustrated in FIG. 3, the CF substrate 10 includes the color filter 50 that includes the light transmissive layers 53. In the color filter 50, the color layers 52 are disposed on the back surface of the glass substrate 11 such that the edge sections of the color layers 52 extend over the back surfaces (the top surfaces) of the light transmissive layers 53 and the sections of the back surface (the top surface) of the light blocking layer 51. A first difference in level between the back surface of the glass substrate 11 and the back surface of the light transmissive layer 53 is about equal to the thickness d3 of the light transmissive layer 53. A second difference in level between the back surface of the light transmissive layer 53 and the back surface of the light blocking layer 51 is about equal to a difference in thickness between the light blocking layer 51 and the light transmissive layer 53 (d1−d3). These differences are less than the difference in the color filter 950. The color layer 52 bends along surfaces of the light transmissive layer 53 and along the surfaces of the light blocking layer 51. The maximum, thickness d41 of the color layer 52 illustrated in FIG. 5 at a first curve (a part of the area adjacent to the light blocking layer 51) is about equal to a sum of the thicknesses of the color layer 52 and the light transmissive layer 53 (d2+d3). The maximum thickness d42 of the color layer 52 at a second curve (a part of the area adjacent to the light blocking layer 51) is about equal to a sum of the thickness of the color layer 52 and the second difference [d2+(d1−d3)]. The thickness d3 of the light transmissive layer 53 is about ½ of the thickness d1 of the light blocking layer 51. Therefore, d41 and d42 are about equal to each other. If the thickness d2 is about 1.2 μm and the thickness d41 and the thickness d42 are about 1.9 μm, an increase rate is about 1.58. The differences in level in the area adjacent to the light blocking layer 51 are about equal to each other. According to the configuration, the maximum thickness of the section of the color layer 52 around the light blocking layer 51 including steps can be reduced.

In the CF substrate 10, the thickness of the section of the color layer 52 around the light blocking layer 51 and the light transmissive layer 53 is not increased. The light transmissive layer 53 has the light transmissivity greater than that of the color layer 52 for all wavelengths in the visible light range. The transmitting light TL2 in the area adjacent to the light blocking layer 51 is tinted slightly deeper and reduced in amount in comparison to the transmitting light TLX in the blank area BNR, However, differences between TL1 and TL2 are significantly small in comparison to the transmitting light TL92 in the conventional CF substrate 92. In the liquid crystal panel 1 including the CF substrate 10, the uneven density and the reduction in brightness are less likely to occur in the display area. Therefore, images can be displayed with higher quality.

As described above, the CF substrate 10 (the color filter substrate) includes the glass substrate 11 (the light transmissive substrate), the light blocking layer 51, the light transmissive layers 53, and the color layers 52. The glass substrate 11 passes rays of the visible light. The light blocking layer 51 is formed in the predefined pattern on the glass substrate 11 and configured to block rays of the visible light. The light transmissive layers 53 are formed along the edges of the light blocking layer 51 on the glass substrate 11 and configure to pass rays of the visible light. The color layers 52 are formed on the glass substrate 11 and colored to pass rays of the visible light and tint the transmitting light rays the predefined colors. The color layers 52 include the sections disposed in the blank areas BNR on the back surface (the top surface) of the glass substrate 11 in which the light blocking layer 51 and the light transmissive layers 53 are not present. The edge sections of the color layers 52 extend over the back surfaces (the top surfaces) of the light transmissive layers 53 and the sections of the back surface (the top surface of the light blocking layer 51. The light transmissive layers 53 have the light transmissivity greater than that of the color layers 52 for the entire wavelength range of the visible light. The thickness of each light transmissive layer 53 on the blank area BNR side is less than the thickness of the light transmissive layer 53 on the light blocking layer 51 side.

In the CF substrate 10, the color layers 52 are disposed in the blank areas BNR on the back surface of the glass substrate 11 without the light blocking layer 51 and the light transmissive layers 53 between the back surface of the glass substrate 11 and the color layers 52. According to the configuration, the light transmissivity in the areas can be maintained at a higher level. The color layers 52 extend from the blank areas BNR to the top surface of the light blocking layer 51. According to the configuration, the areas along the edges of the light blocking layer 51 (around the edges of the voids of the grid pattern) are properly covered with the color layers 52. Therefore, the leak of light is less likely to occur in the areas.

In the CF substrate 10, the light transmissive layers 53 having the thickness less than that of the light blocking layer 51 in the blank areas BNR are disposed along the edges of the light blocking layer 51. According to the configuration, the difference in level between the glass substrate 11 and the light blocking layer 51 can be reduced. Therefore, the thickness of the sections of the color layers 52 around the light blocking layer 51 in the normal direction to the plate surface of the glass substrate 11 is less likely to increase. The light transmissive layers 53 have the light transmissivity greater than that of the color layers 52 for the entire wavelength range of the visible light. In comparison to the conventional CF substrate 910 illustrated in FIG. 5, the density unevenness and the reduction in light transmissivity are less likely to occur in the areas around the light blocking layer 51. The light transmissive layers 53 have the constant thickness d3 that is less than the thickness d1 of the light blocking layer 51. The light transmissive layers 53 having such a configuration can be easily formed through the photolithography process. The thickness d3 of the light transmissive layers 53 is set to about ½ of the thickness d1 of the light blocking layer 51. According to the configuration, the first difference and the second difference in level in the areas around the light blocking layer 51 are about equal to each other. The maximum thicknesses d41 and d41 of the color layers 52 can be reduced and thus the thickness of the color layers 52 is less likely to increase.

In the CF substrate 10, the light blocking layer 51 can be formed using a method similar to a known method. Namely, any special limitation is not required for dimensions of the pattern including the width. Therefore, the light blocking layer 51 can be finely patterned on the glass substrate 11 and the CF substrate 10 that can be used in a high-definition display device can be achieved. The light blocking layer 51 includes the edges having the sufficient thickness d1. This makes the boundaries between different colors clear.

In the CF substrate 10, if the thickness of the color layers 52 in the normal direction to the plate surface of the glass substrate 11 varies, designed colors and amounts of light cannot be precisely reproduced. Specifications of the liquid crystal panel 1 may be designed at lower levels. Because the thickness of the color layers 52 is less likely to vary in this embodiment and thus the colors and the amounts of emitting light can be easily maintained at predefined levels. Therefore, the liquid crystal panel 1 having higher optical performance can be obtained.

The CF substrate 10 is includes in the liquid crystal panel 1. The liquid crystal panel 1 having the screen brightness maintained at a higher level can be used in a high-definition display device.

Second Embodiment

The second embodiment will be described with reference to FIG. 4. The second embodiment includes a CF substrate 210 that includes a color filter 250. The color filter 250 includes light transmissive layers 253 formed in a shape different from the shape of the light transmissive layers 53 in the first embodiment. Components of the CF substrate 210 having configurations similar to those of the first embodiment will be indicated by the reference signs that indicate the corresponding components of the first embodiment.

The color filter 250 includes color layers 252, the light transmissive layers 253, and the light blocking layer 51 having the thickness d1. The color layers 252 have the thickness d2 that is equal to the thickness of the color layers 52 of the first embodiment.

Figure 4:
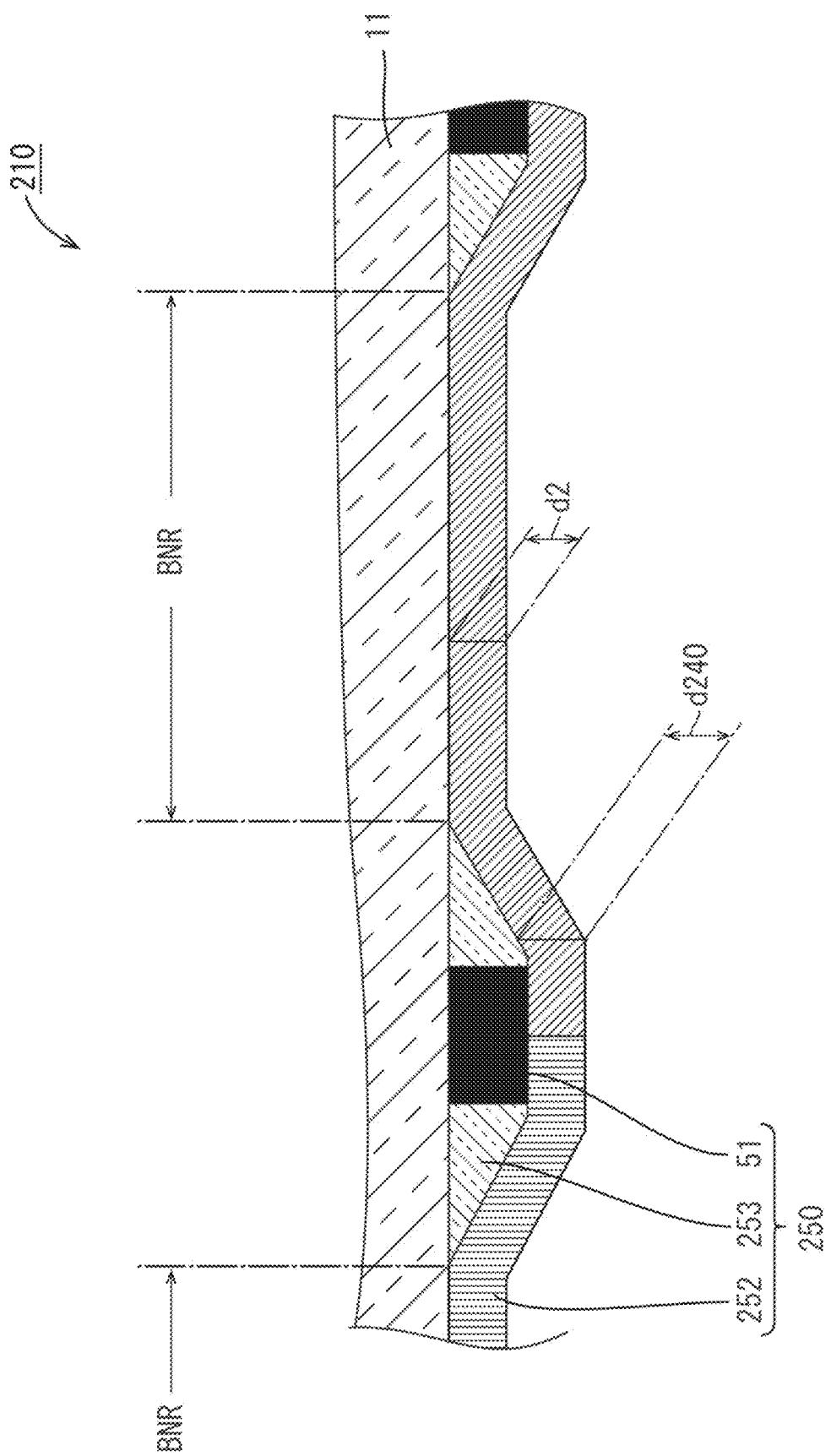
FIG. 4 is a schematic view illustrating a cross-sectional configuration of a color filter including a light blocking layer and therearound according to a second embodiment.

As illustrated in FIG. 4, each light transmissive layer 253 has a triangular cross section with a right angle. A section of the light transmissive layer 253 on the light blocking layer 51 side has a thickness equal to the thickness d1 of the light blocking layer 51. A section of the light transmissive layer 253 on the blank area BNR side has a thickness about equal to zero. The back surface of the glass substrate 11 and the back surface of the light transmissive layer 253 are substantially flush with each other. The back surface of the light transmissive layer 53 and the back surface of the light blocking layer 51 are flush with each other.

Each color layer 252 is disposed on the back surface of the glass substrate 11 such that an edge section of each color layer 252 extends over the back surface (the top surface) of the light transmissive layer 53 and a section of the back surface (the top surface) of the light blocking layer 51. In comparison to the first embodiment, the color layer 252 bends with a gentler angle and the thickness of the color layer 252 in the normal direction to the plate surface of the glass substrate 11 is reduced. The maximum thickness d240 of a section around the light blocking layer 51 and the light transmissive layer 253 illustrated in FIG. 4 depends on an angle of the back surface of the light transmissive layer 253. However, an increase from the thickness d2 of the color layer 252 is significantly smaller in comparison to the configuration in which the color layer bends at a right angle.

The CF substrate 210 will be produced by a method described below.

The glass substrate 11 is prepared. The light blocking layer 51 is formed in a predefined pattern on the glass substrate 11 through the photolithography process. The light transmissive layers 25 are formed along the edges of the light blocking layer 51. The color layers 252 are formed at predefined positions through the photolithography process. An overcoat is formed to cover the color filter 50. If required, photo spacers are formed. An alignment film is formed to cover surfaces of all the layers on the inner side (the liquid crystal layer 30 side) with the spin coating technology.

The light transmissive layers 253 may be formed using a halftone mask and by curing a photosensitive rein such that the thickness of the section of each light transmissive layer 53 on the blank area BNR side is less than the thickness of the section of the light transmissive layer 53 on the light blocking layer 51 side. The halftone mask may be configured such that an amount of exposing light decreases from the light blocking layer 51 side to the blank area BNR side.

Alternatively, the light transmissive layers 253 are formed by arranging thermoplastic resins along the light blocking layer 51 and by heating the thermoplastic resins until corners of the thermoplastic resins melt and flow into the blank areas BNR so that the thickness of the light transmissive layers 253 is about equal to the thickness d1 of the light blocking layer 51.

The light transmissive layers 253 are formed such that the thickness of the section of each light transmissive layer 253 on the light blocking layer 51 side is equal to or less than the thickness of the light blocking layer 51 and the thickness of the section of the light transmissive layer 253 on the blank area BNR side is less than the thickness of the section of the light transmissive layer 253 on the light blocking layer 51 side.

Each light transmissive layer 253 includes the sections on the blank area BNR side and the light blocking layer 51 side having the different thicknesses. According to the configuration, a difference in level between the light blocking layer 51 and the light transmissive layer 253 and a difference in level between the light transmissive layer 253 and the glass substrate 11 (the blank area BNR) can be reduced. Therefore, the thickness of the bending section of the color layer 252 is less likely to increase. The thickness of the color layer 252 in the normal direction to the plate surface of the glass substrate 11 is further less likely to vary and thus the density unevenness and the decrease in the light transmissivity are further less likely to occur.

Each light transmissive layer 253 has the triangular cross section is formed such that the thickness of the section on the light blocking layer 51 side is about equal to the thickness d1 of the light blocking layer 51 and the section of the blank area BNR side continues to the top surface of the glass substrate 11. By adjusting the angle of the top surface of each light transmissive layer 253, the maximum thickness d240 of the color layer in the normal direction to the plate surface of the glass substrate 11 and the area of the blank area BNR in the CF substrate 210 can be altered and a balance between a level of the density unevenness and the overall light transmissive rate in the CF substrate 210 can be adjusted. With the CF substrate 210, the liquid crystal panel 1 in which the density unevenness and the screen brightness are within designed ranges can be obtained.

The CF substrate 210 is produced by a method of producing a color filter substrate including a light blocking layer forming process, a light transmissive layer forming process, and a color layer forming process. The light blocking layer forming process includes forming the light blocking layer 51 for blocking rays of the visible light in the predefined pattern on the glass substrate 11 (the light transmissive substrate) configured to pass rays of the visible light. The light transmissive layer forming process includes forming the light transmissive layers 253 for passing rays of the visible light along the edges of the light blocking layer 51 on the glass substrate 11. The color layer forming process includes forming the color layers 52 such that the section of each color layer 52 is disposed in the blank area BNR on the back surface; (the top surface) of the glass substrate 11 without the light blocking layer 51 and the light transmissive layer 53 between the color layer 52 and the back surface of the glass substrate 11 and the edge of the color layer 52 extends from the section over the back surface (the top surface) of the light transmissive layer 53 and the section of the back surface (the top surface) of the light blocking layer 51. In the light transmissive layer forming process, the halftone mask is used and the photosensitive resin is cured so that the thickness of the section of each light transmissive layer 253 on the blank area side is less than the thickness of the section of the light transmissive layer 253 on the light blocking layer 51 side. The halftone mask is configured so that the amount of exposing light decreases from the light blocking layer 51 side to the blank area BNR side.

With such a simple method, the light transmissive layers 253 are formed such that the thickness of the section of each light transmissive layer 253 on the light blocking layer 51 side is less than the thickness d1 of the light blocking layer 51 and the thickness of the section of the light transmission layer 253 on the blank area BNR side is less than the thickness of the section of the light transmissive layer 253 on the light blocking layer 51 side. The thickness of the color layers 252 in the normal direction to the plate surface of the glass substrate 11 is further less likely to vary. The CF substrate 210 in which the density unevenness and the decrease in light transmissivity are less likely to occur is obtained.

Alternatively, the CF substrate 210 may be produced by a method of producing a color filter substrate including a light transmissive layer forming process that is different from the light transmissive layer forming process in the method described above. The light transmissive layer forming process includes arranging the thermoplastic resins having the predefined thickness along the edges of the light blocking layer 51 and heating the thermoplastic resins until the corners of the thermoplastic resins melt and flow toward the blank areas BNR so that the thickness of the section of each light transmissive layer 253 on the blank area BNR side is equal to or less than the thickness of the section of the light transmissive layer 253 on the light blocking layer 51 side.

With such a simple method, the light transmissive layers 253 are formed such that the thickness of the section of each light transmissive layer 253 on the blank area BNR side is less than the thickness of the section of the light transmissive layer 253 on the light blocking layer 51 side.

Other Embodiments

The technology described herein is not limited to the embodiments described above and with reference to the drawings. The following embodiments may be included in the technical scope.

(1) The light transmissive layers 53 may be formed such that each light transmissive layer 53 has a cross section in a shape other than the triangular shape with the right angle. As long as the thickness of the section of each light transmissive layer 53 on the blank area BNR side is less than the thickness of the section of the light transmissive layer 53 on the light blocking layer 51 side, the light transmissive layer 53 can be formed in any shape with any shape of cross section such as a triangular shape, a trapezoidal shape, a fan shape, a stepped shape, and a shape; including an irregular edge. This is applicable to the light transmissive layers 253.

(2) The light blocking layer 51 may be formed in a pattern other than the pattern described above. For example, the light blocking layer 51 may be formed in a pattern including slits or triangular voids.

(3) The color layers 52 may include yellow color layers in addition to the red color layers 52R, the green color layers 52G, and the blue color layers 52B, The color layers in different colors may be arranged differently from, the arrangement described above. For example, the color layers in the same color may be arranged in columns and the columns of the color layers in different colors may be arranged adjacent to each other to form a strip pattern. Alternatively, the color layers may be arranged such that the color layers in the same color form a stepped pattern.

(4) A CF substrate that includes a thin protective film formed to cover am entire plate surface of the glass substrate and color layers formed on the thin protective film in blank areas BNR may be includes in the scope of the technology described herein.

(5) The layers may be formed through processing other than the photolithography process. For example, a resin film may be bonded to a light transmissive substrate with an adhesive. A resin pattern formed on a substrate may be transferred to a light transmissive substrate. Ink may be applied to predefined areas with an inkjet technology.

(6) The technology described herein may be applied to a CF substrate including a common electrode and used in a display panel that operates in in-plane switching (IPS) mode or vertical alignment (VA) mode.

(7) The technology described herein may be applied to CF substrates for plasma display panels, organic light emitting display panels, and inorganic light emitting display panels. According to the technology described herein, various types of display panels capable of displaying high-definition images can be provided.

The invention claimed is:

1. A color filter substrate comprising:
   a light transmissive substrate configured to pass rays of visible light;
   a light blocking layer formed in a predefined pattern on the light transmissive substrate to block rays of the visible light;
   a light transmissive layer formed along an edge of the light blocking layer on the light transmissive substrate; and
   a color layer formed on the light transmissive substrate, configured to pass rays of the visible light, and tinted a predefined color so that the rays of the visible light passing therethrough exhibit a predefined color, wherein
   the color layer includes a section disposed on a top surface of the light transmissive substrate in a blank area in which the light blocking layer and the light transmissive layer are not present and an edge section extending from the section in the blank area over a top surface of the light transmissive layer and a section of a top surface of the light blocking layer,
   the light transmissive layer has light transmissivity greater than light transmissivity of the color layer for an entire wavelength range of the visible light, and
   the light transmissive layer is formed so that a thickness of a section on a blank area side is less than a thickness of the light blocking layer.

2. The color filter substrate according to claim 1, wherein the light transmissive layer is formed so that the thickness of the section on the light blocking layer side is less than a thickness of the light blocking layer and the thickness of the section on the blank area side is less than the thickness of the section on the light blocking layer side.

3. A display panel comprising the color filter substrate according to claim 1.

4. A method of producing a color filter substrate, the method comprising:
   forming a light blocking layer in a predefined pattern on a light transmissive substrate configured to pass rays of visible light to block rays of the visible light;
   forming a light transmissive layer along an edge of the light blocking layer on the light transmissive substrate to pass rays of the visible light; and
   forming a color layer tinted so that rays of the visible light passing therethrough exhibit a predefined color on a top surface of the light transmissive substrate such that a section of the color layer is disposed in a blank area in which the light blocking layer and the light transmissive layer are not present and an edge section of the color layer extends from the section in the blank area over a top surface of the light transmissive layer and a section of a top surface of the light blocking layer, wherein
   the forming the light transmissive layer includes curing a photosensitive resin using a halftone mask configured to reduce an amount of exposing light from the light blocking layer side to the blank area side so that the thickness of the section of the light transmissive layer on the blank area side is less than the thickness of the section of the light transmissive layer on the light blocking layer side.

5. A method of producing a color filter substrate, the method comprising:
   forming a light blocking layer in a predefined pattern on a light transmissive substrate configured to pass rays of the visible light to block rays of the visible light;
   forming a light transmissive layer along an edge of the light blocking layer on the light transmissive substrate to pass rays of the visible light; and
   forming a color layer tinted so that rays of the visible light passing therethrough exhibit a predefined color on a top surface of the light transmissive substrate such that a section of the color layer is disposed in a blank area in which the light blocking layer and the light transmissive layer are not present and an edge section of the color layer extends from the section in the blank area over a top surface of the light transmissive layer and a section of a top surface of the light blocking layer, wherein
   the forming the light transmissive layer includes arranging a thermoplastic resin having a redefined thickness along an edge of the light blocking layer and heating the thermoplastic resin until a corner thereof melts and flows toward the blank area so that a thickness of a section of the light transmissive layer on a blank area side is equal to or less than a thickness of a section of the light transmissive layer on a light blocking area.

* * * * *